United States Patent
Cho et al.

(10) Patent No.: US 7,136,551 B2
(45) Date of Patent: Nov. 14, 2006

(54) OPTICAL PRINTED CIRCUIT BOARD AND OPTICAL INTERCONNECTION BLOCK USING OPTICAL FIBER BUNDLE

(75) Inventors: Mu Hee Cho, Daejeon (KR); Han Seo Cho, Daejeon (KR); Hyo Hoon Park, Daejeon (KR); Jong Ho Lee, Suwon (KR); Kyung Rok Kim, Seongnam (KR)

(73) Assignees: Information and Communication Univerity Research and Industrial Cooperation Group, Daejeon (KR); SKC Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/069,870

(22) Filed: Mar. 1, 2005

(65) Prior Publication Data

US 2006/0045418 A1    Mar. 2, 2006

(30) Foreign Application Priority Data

Aug. 25, 2004    (KR) .................. 10-2004-0067105

(51) Int. Cl.
*G02B 6/42* (2006.01)
*G02B 6/26* (2006.01)

(52) U.S. Cl. .................. 385/31; 385/14; 385/15; 385/115; 385/32

(58) Field of Classification Search ............ 385/31–32, 385/115
See application file for complete search history.

(56) References Cited

U.S. PATENT DOCUMENTS

| 4,732,446 A | * | 3/1988 | Gipson et al. ............... 385/24 |
| 5,253,310 A | * | 10/1993 | Delbare et al. ............... 385/14 |
| 6,259,840 B1 | * | 7/2001 | Munoz-Bustamante et al. ............... 385/39 |
| 6,527,456 B1 | * | 3/2003 | Trezza ............... 385/89 |
| 6,801,693 B1 | * | 10/2004 | Jacobowitz et al. ........... 385/50 |

FOREIGN PATENT DOCUMENTS

KR    10-2005-0097693 A    10/2005

* cited by examiner

*Primary Examiner*—Frank G. Font
*Assistant Examiner*—Eric Wong
(74) *Attorney, Agent, or Firm*—Alston & Bird LLP

(57) ABSTRACT

Disclosed is an optical printed circuit board (PCB) having a multi-channel optical waveguide, which comprises: an optical waveguide having an optical path for transmitting light beams; a groove for penetrating the optical waveguide; and an optical interconnection block inserted in the groove and connected to the optical waveguide to transmit the light beams, wherein the optical interconnection block includes an optical fiber bundle bent by the angle of 90°. The optical interconnection block connects a plurality of multi-layered optical waveguides to transmit light beams to the optical waveguides. The optical fiber bundle is installed as a medium of the multi-channel optical waveguide in the optical PCB.

5 Claims, 12 Drawing Sheets

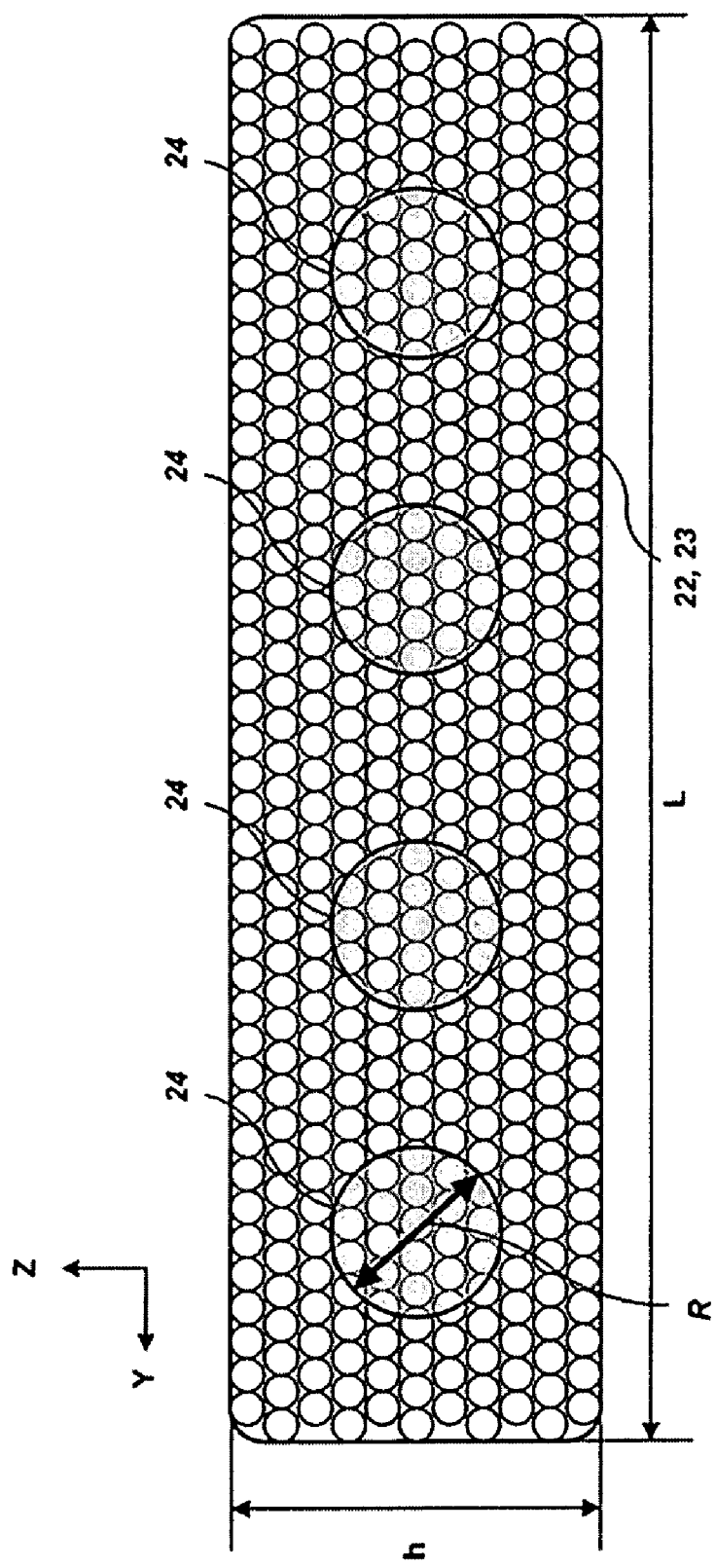

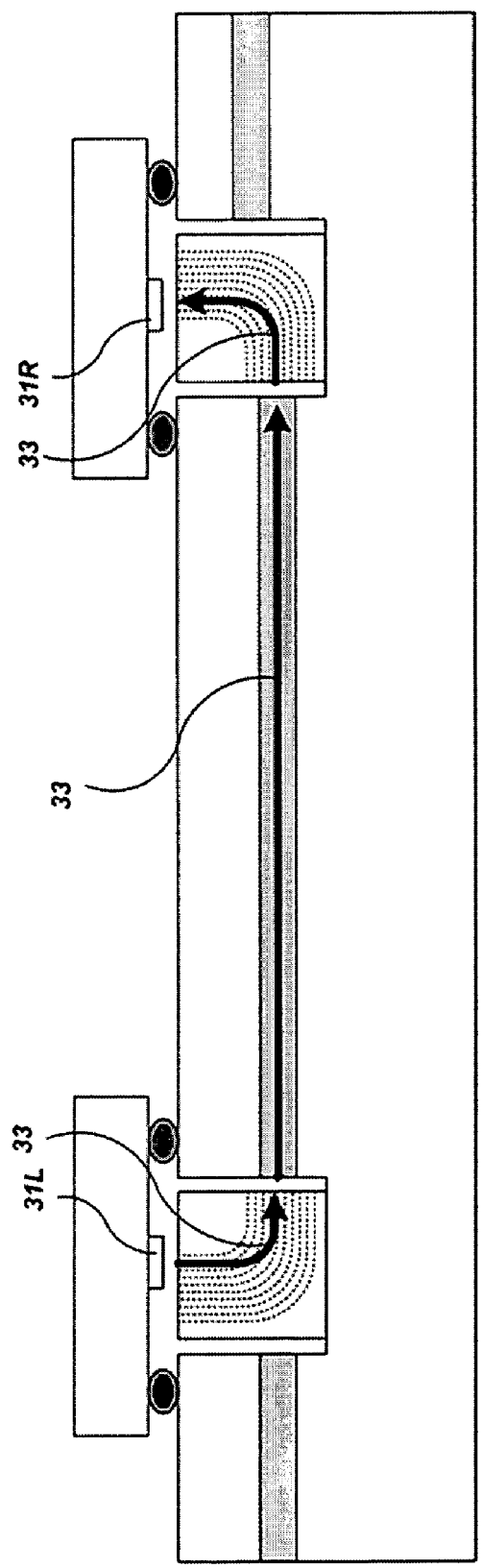

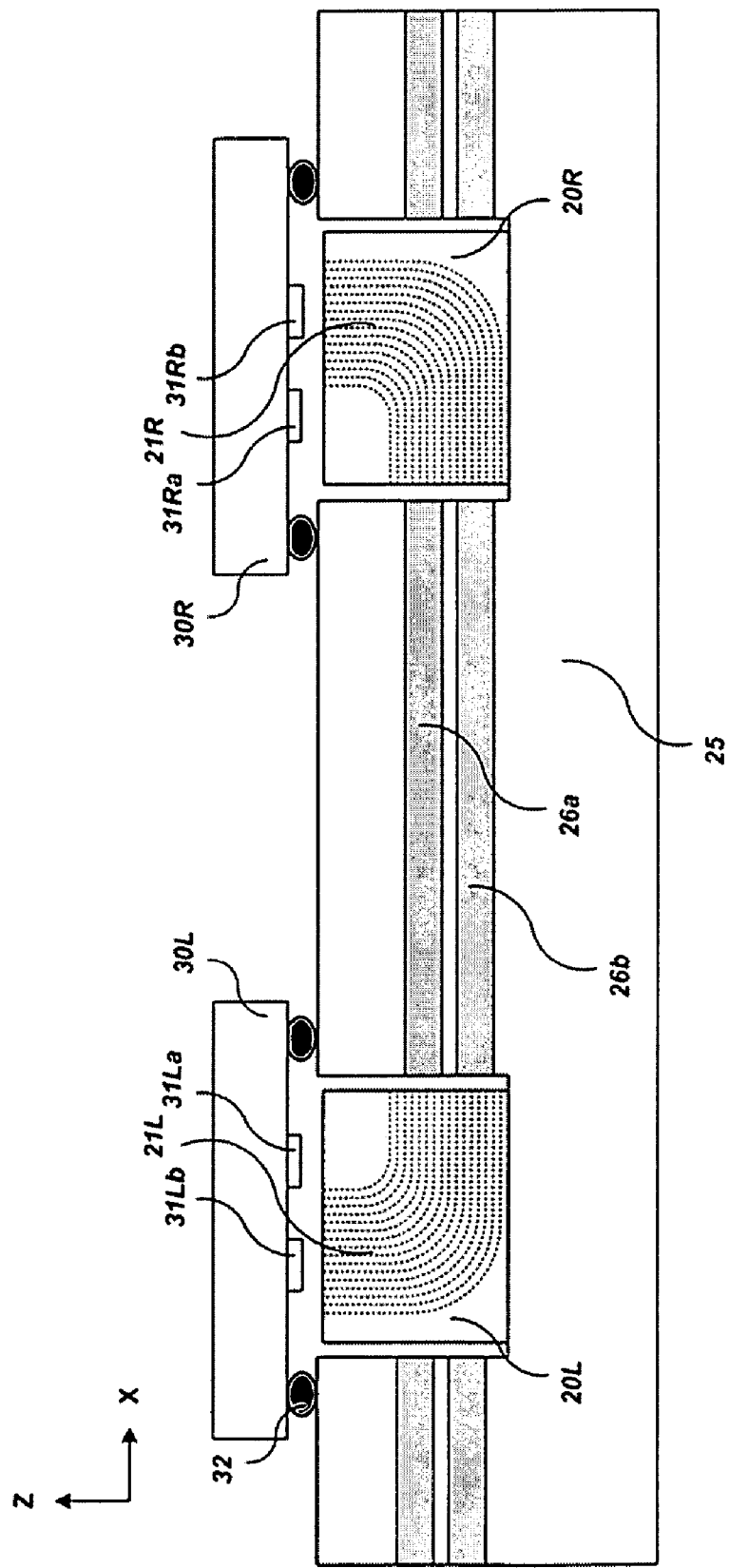

OPTICAL PRINTED CIRCUIT BOARD AND OPTICAL INTERCONNECTION BLOCK USING OPTICAL FIBER BUNDLE

CROSS REFERENCE TO RELATED APPLICATION

This application claims priority to and the benefit of Korea Patent Application No. 10-2004-67105 filed on Aug. 25, 2004 in the Korean Intellectual Property Office, the entire content of which is incorporated herein by reference.

BACKGROUND OF THE INVENTION (a) Field of the Invention

The present invention relates to an optical printed circuit board (PCB) and an optical interconnection block using an optical fiber bundle. More specifically, the present invention relates to an optical printed circuit board with a built-in optical waveguide, and an optical interconnection block in optical PCB based optical interconnectors.

(b) Description of the Related Art

In general, a printed circuit board (PCB) represents a phenol-resin or epoxy-resin circuit board on which various components are mounted and paths for interconnecting the components are fixedly printed. As to a PCB manufacturing process, a thin film of copper is attached to one side of a phenol-resin insulation board or an epoxy-resin insulation board, the thin film is etched according to predetermined patterns to configure a desired circuit, and holes for mounting components are generated.

The PCB can be classified as a single layer substrate, a double layer substrate, and a multi-layered substrate, and the multi-layered substrates are used in high-precision products because the increased layers allows more installation capacity. A multi-layered PCB represents a printed circuit board having conductive patterns on at least three layers that are separated by insulation matter.

The copper film is patterned to form an inner layer and an outer layer on the PCB in the conventional PCB manufacturing process, but high polymers and glass fibers have been recently used to insert optical waveguides into the PCB, which is referred to as an electro-optical circuit board (EOCB). The EOCB has optical waveguides and glass substrates in addition to the copper circuit patterns and allows both electrical signals and optical signals so that the EOCB may interface very high-speed data communication executed on the same board by using optical signals and may convert the optical signals into electrical signals and store data or process signals.

Various coupling methods for connecting the optical signals on the multi-layered PCB have been proposed, and general multi-channel interconnection methods include the direct writing method, the beam reflection method, the reflection mirror using method, and the direct coupling method.

FIG. 1 shows a conventional optical PCB and an optical connection structure using an optical interconnection block.

Referring to FIG. 1, a via hole is generated in the optical PCB 1, and an optical connection rod 4 having a reflection mirror with the angle of 45° on the top thereof is inserted into the via hole. In this instance, the reflection mirror is formed by coating silver (Ag) or aluminum (Al) on the optical connection rod 4, or the same is configured by attaching an additional reflection mirror thereon. Light beams output by a light source of an optical transmitter are reflected by 90° on the mirror with the angle of 45° to be transmitted through an optical waveguide 2 to a mirror with the angle of 45° of the optical connection rod 4 at the side of an optical receiver, and the light beams, again reflected by 90° on the mirror, are transmitted to a photo-detector 6 of the optical receiver.

For example, when electrical signals are applied to the optical transmitter by a process board, the electrical signals are converted into optical signals by a laser diode 5, the optical signals are transmitted through a lens to the left reflection mirror to be reflected, the reflected optical signals are provided through the optical waveguide to the right reflection mirror to be reflected again, and the reflected optical signals are transmitted through another lens to a photodiode 6 functioning as a photo-detector in the optical receiver. In this instance, the optical waveguide transmits the light beams through a multi-mode polymer waveguide core with low loss, and a waveguide clad is formed around the core. Therefore, the electrical signals provided by the left processor board are converted into optical signals and transmitted to the right processor board, and are then converted into electrical signals again.

In the prior art, when the vertical cavity surface emitting laser (VCSEL) 5 emits light, a micro-lens gathers the light and transmits the same to the optical waveguide through a PCB hole or an optical via hole 3, and the light is transmitted to another layer through the hole. A silicon optical bench (SiOB) generally referred to as a silicon wafer is formed on the PCB 1, and a polymer substrate can be used for the SiOB. The optical waveguide transmits the light provided by the VCSEL through the lens to another optical waveguide on another layer.

The VCSEL represents a light source for vertically outputting laser beams on a substrate and is used to transmit and amplify optical data. LEDs and edge emitting laser diodes (LDs) have been widely used as the light sources, although surface-emitting lasers (SELs), developed in the nineties, have recently come to be used instead of the LEDs and the edge emitting LDs. The VCSELs are used for optical fiber communication, interface, and parallel processing of large amounts of information.

FIGS. 2A and 2B show conventional optical interconnection blocks configured by optical interconnectors for transmitting light beams of various channels in parallel.

Referring to FIG. 2A, the optical interconnection block includes a plurality of optical connection rods 8 in parallel, each having a mirror 10 with the reflection angle of 45°. Vertical light beams 11 output from the light source of the transmitter or input to the photo-detector of the receiver are input to/output from the side 9 of the transmitter of the optical connection rod 8, and the light beams are reflected on the mirror 10 by the angle of 90°, and are then horizontally transmitted through the optical waveguide 2 of the optical PCB 1 of FIG. 1.

Referring to FIG. 2B, the optical interconnection block includes a plurality of parallel optical connection rods 8 bent by the angle of 90°. Vertical light beams 17 output from the light source of the transmitter or input to the photo-detector of the receiver are input to/output from the side 15 of the transmitter of an optical fiber 14, and the light beams are horizontally transmitted through the optical fiber 14 and are transmitted through the optical waveguide 2 of the optical PCB 1 of FIG. 1.

However, it is difficult to accurately match the position of the optical fiber 8 or 14 in the optical interconnection block with the position of the optical waveguide 2 of the optical PCB 1 since the optical interconnection blocks are connected with a single optical fiber for each optical signal channel. That is, it is difficult to control an optical path when the optical paths, in the order of the light source 5 of the transmitter←→the optical fibers 8 and 14 in the optical interconnection block ←→the optical waveguide 2 in the optical PCB ←→the optical fibers 8 and 14 ←→the photodetector 6 of the receiver, cross each other and the light beams are provided to an adjacent channel.

SUMMARY OF THE INVENTION

It is an advantage of the present invention to provide an optical PCB using an optical fiber bundle, and an optical interconnection block for increasing the tolerance of misalignment without using a single optical fiber for each channel.

It is another advantage of the present invention to provide an optical PCB using an optical fiber bundle, and an optical interconnection block for using an optical fiber bundle in a multi-layered optical PCB and an optical interconnection block to generate optical waveguides once, instead of individually generating the optical waveguides.

In one aspect of the present invention, an optical printed circuit board (PCB) having a multi-channel optical waveguide comprises: an optical waveguide having an optical path for transmitting light beams; a groove for penetrating the optical waveguide; and an optical interconnection block inserted in the groove and connected to the optical waveguide to transmit the light beams, wherein the optical interconnection block includes an optical fiber bundle bent by the angle of 90°.

The optical interconnection block connects a plurality of multi-layered optical waveguides to transmit light beams to the optical waveguides.

A diameter of a core of an optical fiber ranges from 0.5 to 20 μm.

A radius of inside curvature of the optical fiber bundle ranges from 0.1 to 10 mm within the thickness of the optical PCB.

The optical fiber bundle is installed as a medium of the multi-channel optical waveguide in the optical PCB.

In another aspect of the present invention, an optical interconnection block for transmitting light beams comprises: an optical fiber bundle having a plurality of optical fibers bent by the angle of 90°; and a filler for fixing the optical fiber bundle in the optical interconnection block.

The optical fiber includes a core and a clad, and a diameter of the core ranges from 0.5 to 20 μm.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 3B shows a cross-sectional view of an optical interconnection block using an optical fiber bundle according to an exemplary embodiment of the present invention;

FIG. 5B shows a light beam propagation path according to an exemplary embodiment of the present invention;

FIG. 6 shows an assembled structure of optical interconnection blocks, a multi-layered optical PCB, and optical transmit/receive modules according to an exemplary embodiment of the present invention;

DETAILED DESCRIPTION OF THE PREFERRED EMBODIMENTS

Figure 1:
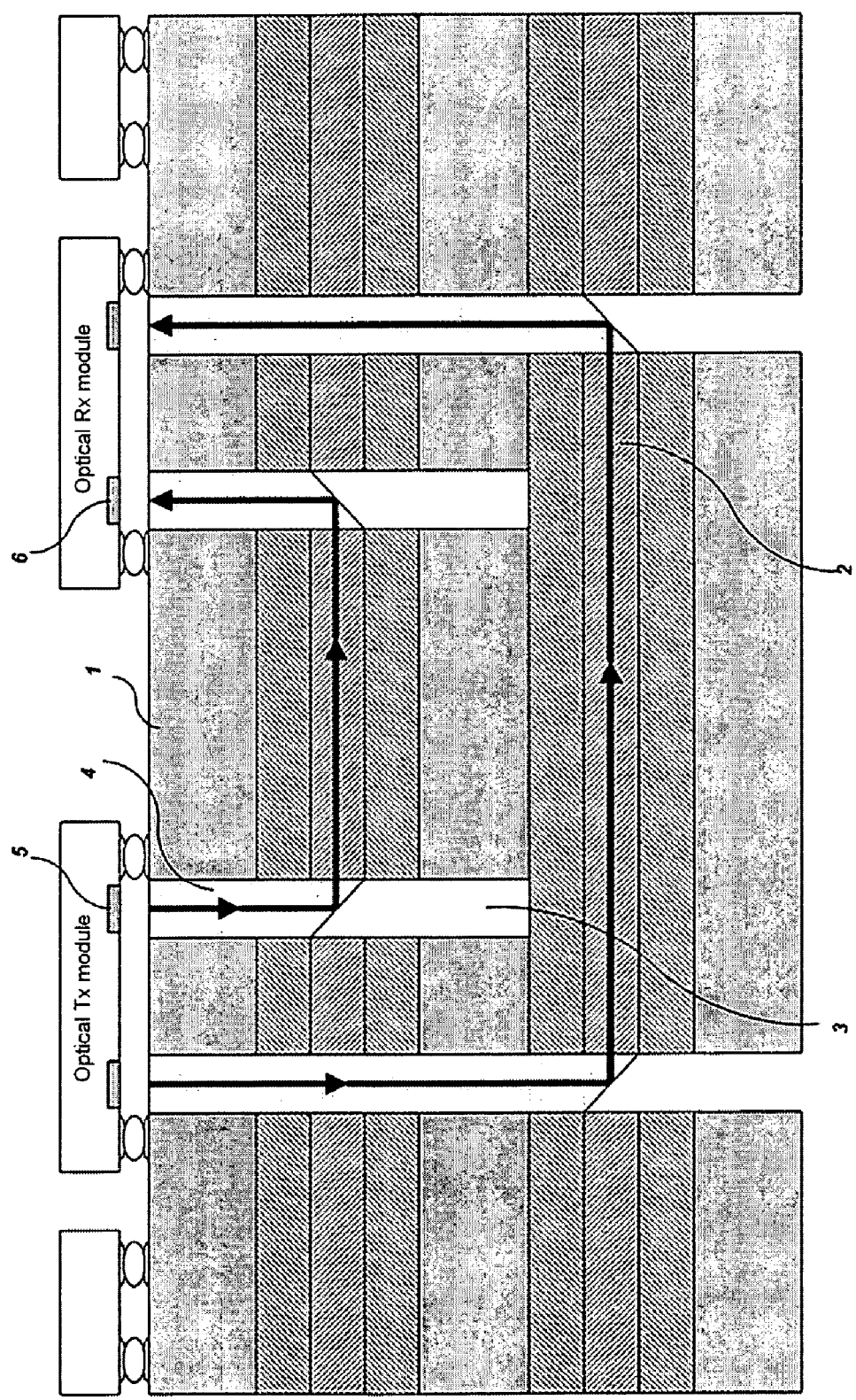
FIG. 1 shows a conventional optical PCB and an optical connection structure using optical interconnection blocks.
Figure 2A:
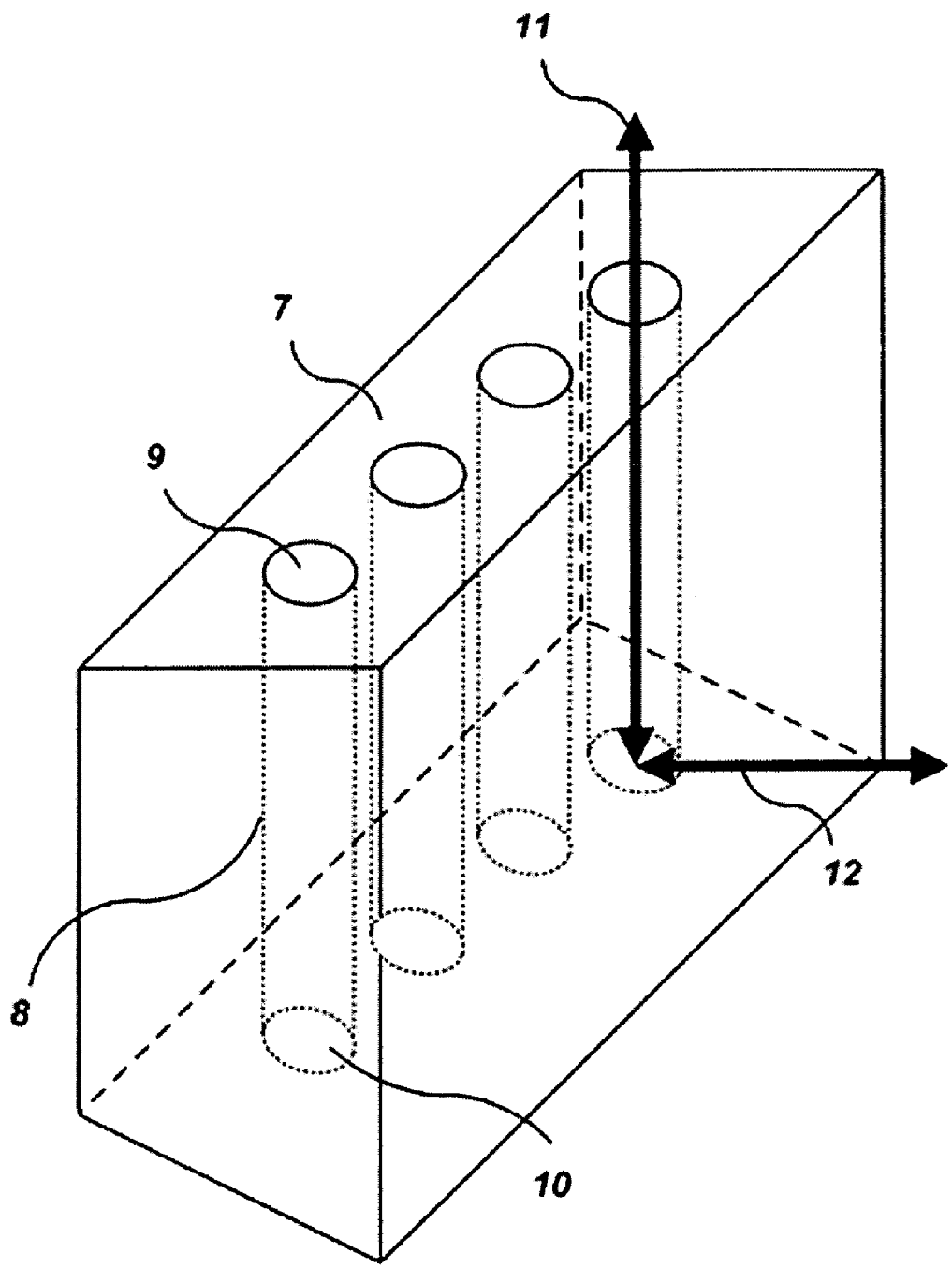
FIGS. 2A and 2B show conventional optical interconnection blocks.
Figure 2B:
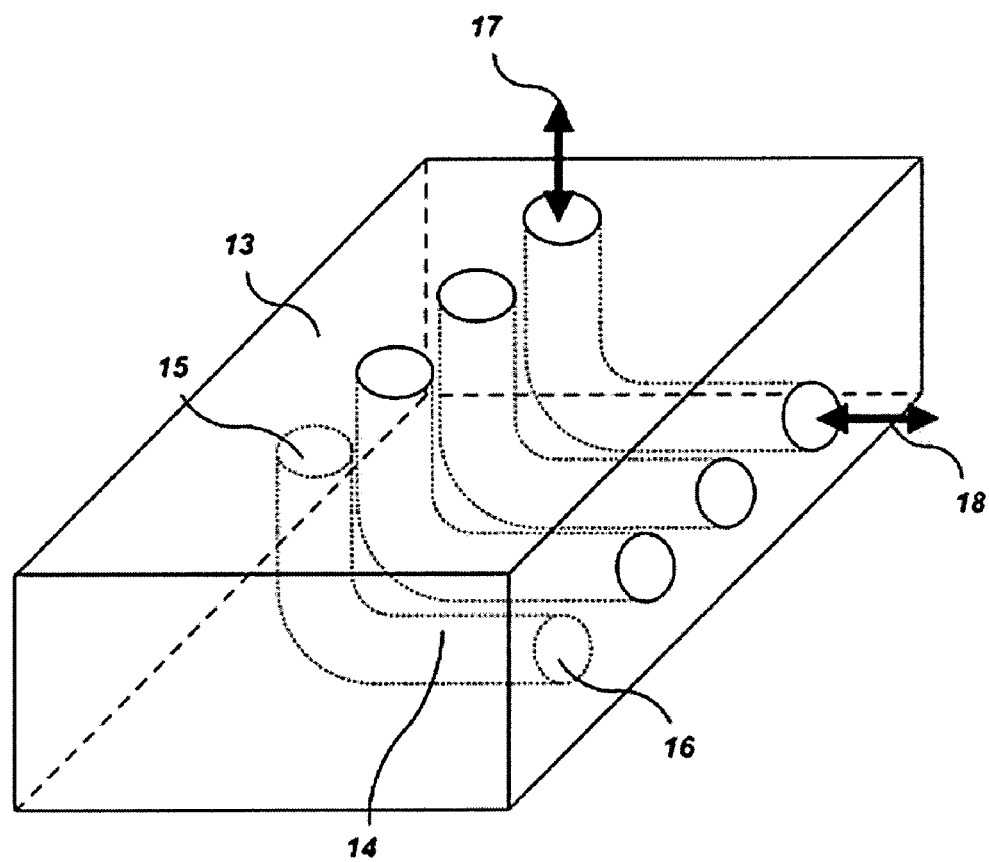

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which same descriptions are provided have the same reference numerals.

Figure 3A:
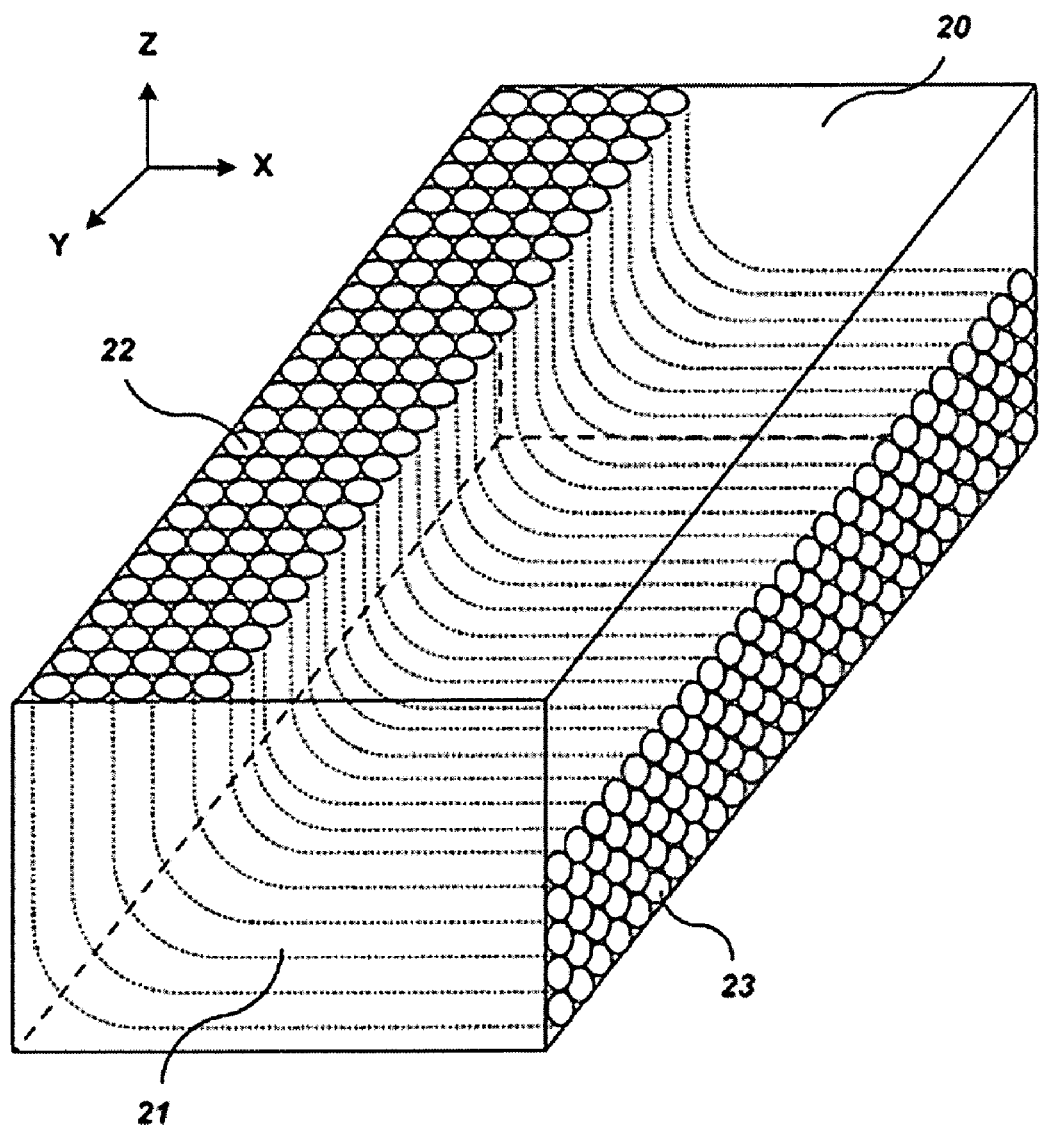
FIG. 3A shows an optical interconnection block using an optical fiber bundle according to an exemplary embodiment of the present invention.

FIG. 3A shows an optical interconnection block using an optical fiber bundle bent by the angle of 90° according to an exemplary embodiment of the present invention, and FIG. 3B shows a cross-sectional view (a top surface 22 or a side surface 23) of an optical interconnection block using an optical fiber bundle according to an exemplary embodiment of the present invention.

Referring to FIGS. 3A and 3B, the optical interconnection block 20 has an optical fiber bundle 21 in a filler, a diameter of the fiber is very much less than the diameter R of a light beam 24 for transmitting optical signals of each channel, and the optical fibers 21 are bent by the angle of 90° so as to transmit the light beams 24 in the vertical direction.

When the height h and the length L of the optical interconnection block 20 including the optical fibers 21 are established to be greater than the diameter R, the tolerance of misalignment is increased since the light beams 24 are connected when the light beams 24 are located at any area of the optical fiber bundle 21.

Also, each optical fiber of the bundle is an independent optical waveguide, and no light beam 24 digresses from the optical fiber during transmission, and hence, the light beams are transmitted to the top surface 22 or the side surface 23 of the optical interconnection block 20 without changes of diameters of the light beams.

Figure 4:
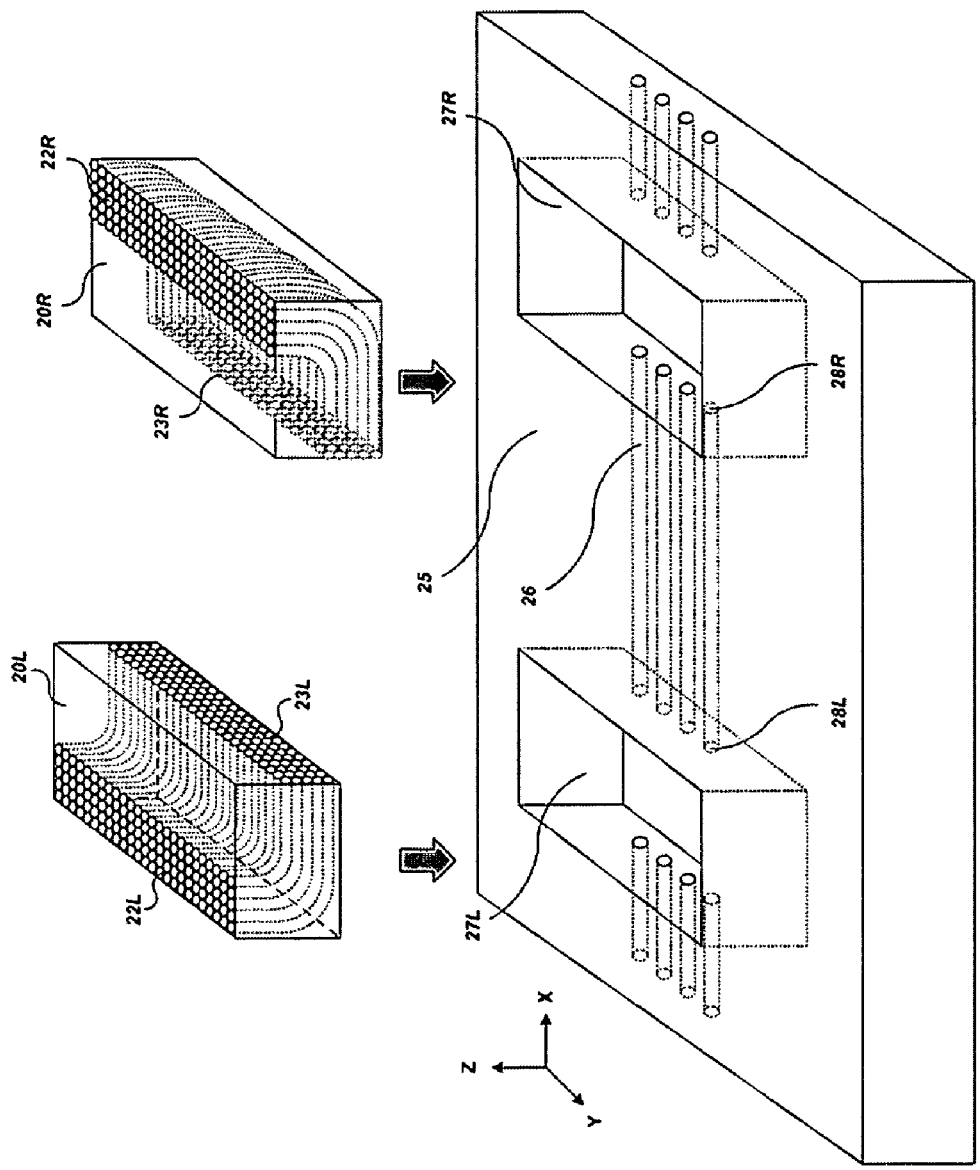
FIG. 4 shows a process for assembling optical fiber bundles into grooves in an optical PCB according to an exemplary embodiment of the present invention.
Figure 5A:
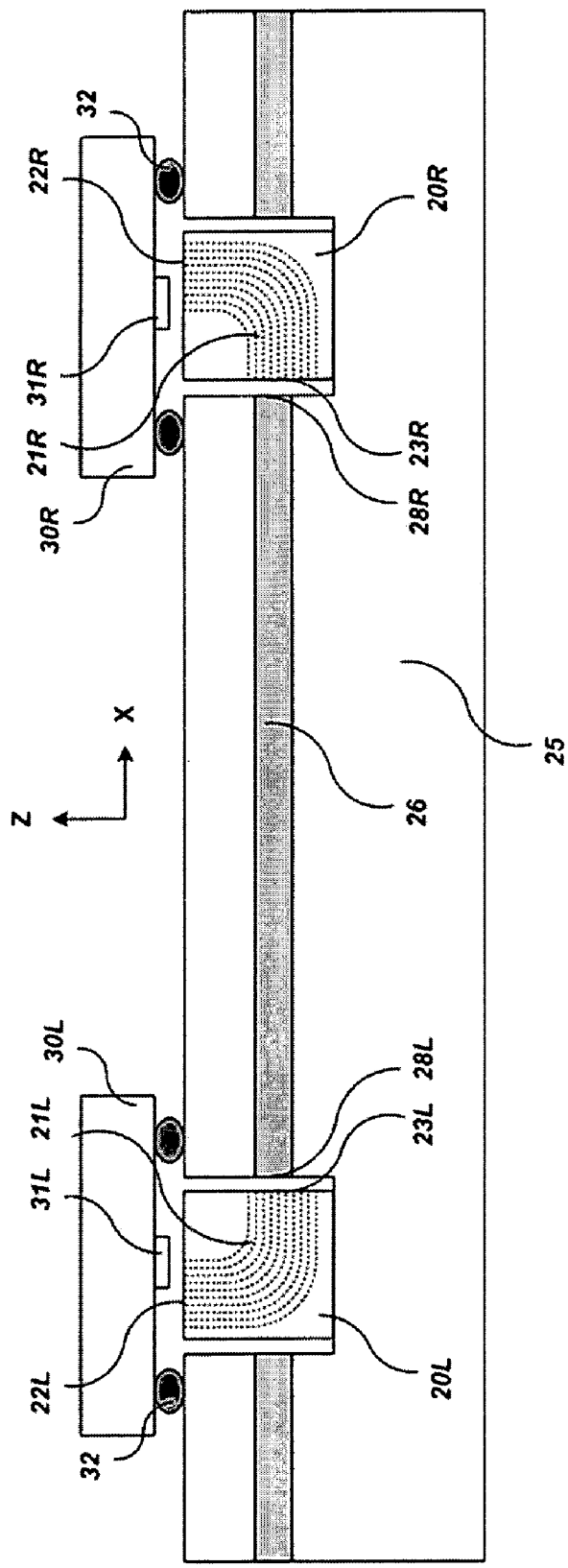
FIG. 5A shows an assembled structure of an optical interconnection block, an optical PCB, and an optical transmit/receive module according to an exemplary embodiment of the present invention.

FIG. 4 shows a process for assembling optical fiber bundles into grooves in an optical PCB, FIG. 5A shows an assembled structure of an optical interconnection block, an optical PCB, and an optical transmit/receive module, and FIG. 5B shows a light beam propagation path.

Referring to FIGS. 4 to 5B, optical waveguides 26 are provided in the optical PCB 25, where the optical waveguide 26 includes a polymer optical waveguide and an optical fiber.

As shown in FIG. 4, 4-channel optical waveguides are provided in the optical PCB 25, a groove 27L on the transmitter side and another groove 27R on the receiver side are generated in the optical PCB 25, and optical interconnection blocks 20L and 20R are respectively inserted into the grooves.

When an optical transmit module 30L and an optical receive module 30R are installed on the optical interconnection blocks 20L and 20R, as shown in FIG. 5A, after assembling the optical interconnection blocks 20L and 20R, the light beam 33 is transmitted in the order of a light source 31L of the optical transmit module 30L, a top surface 22L of the optical interconnection block 20L on the transmitter side, a side surface 23L of the optical interconnection block 20L, an optical waveguide surface 28L on the transmitter side in the optical PCB 25, an optical waveguide surface 28R on the receiver side, a side surface 23R of the optical interconnection block 20R, a top surface 22R of the optical interconnection block 20R, and a photo-detector 31R of the optical receive module 30R.

The tolerance of misalignment is increased in the alignment in the side direction (the Y direction) and the depth direction (the Z direction) in the optical PCB by controlling the height h and the length L of the top surfaces 22L and 22R and the side surfaces 23L and 23R to be greater than the surfaces 28L and 28R of the optical waveguide in the assembling process for alignment between the optical interconnection blocks 20L and 20R and the optical waveguides 28L and 28R.

However, no tolerance of misalignment is increased in the alignment between the optical transmit and receive modules 30L and 30R and the optical interconnection blocks because it is needed to accurately align the light source 31L and the photo-detector 31R respectively on a predetermined position to which the light beam is input on the top surface 22L and on another predetermined position from which the light beam is output on the top surface 22R, since the positions are determined after the optical interconnection blocks 20L and 20R are assembled.

In this instance, the optical interconnection blocks using an optical fiber bundle are more applicable to an optical PCB into which multi-layered optical waveguides are installed, as shown in FIG. 6. An electrical connector 32 includes a solder for attaching the above-noted optical transmit and receive modules.

FIG. 6 shows an assembled structure of optical interconnection blocks, a multi-layered optical PCB, and optical transmit/receive modules according to an exemplary embodiment of the present invention.

Referring to FIG. 6, multi-layered optical waveguides 26a and 26b are connected to the optical interconnection blocks once when the height h of the optical interconnection blocks 20L and 20R is established to be higher than the height of the multi-layered optical waveguides.

Figure 7:
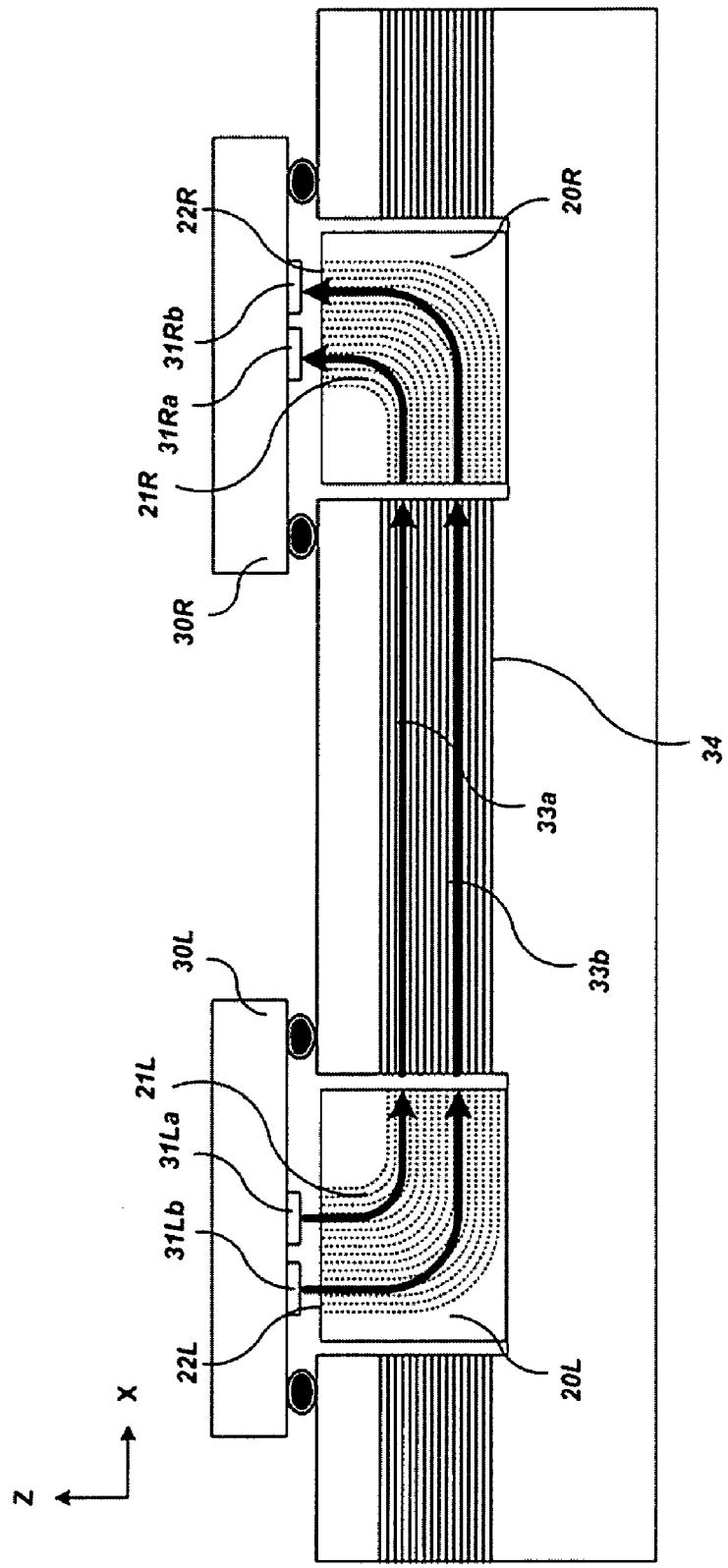
FIG. 7 shows a light beam propagation path in a multi-layered optical PCB according to an exemplary embodiment of the present invention.

FIG. 7 shows a light beam propagation path in a multi-layered optical PCB according to an exemplary embodiment of the present invention where the optical waveguide installed in the optical PCB is made of an optical fiber bundle.

Referring to FIG. 7, the optical fiber bundle is used as the optical waveguide 34 in the multi-layered optical PCB, and hence, the optical waveguide 34 is formed once without generating the individual optical waveguides at regular pitches, and is applicable to a multi-layered optical connection structure.

As shown, the optical interconnection structure between two layers is achieved by generating an N×M multi-channel optical connection (where N is a number of channels in the y direction and M is a number of channels (layers) in the z direction) without generating an inter-layer optical interconnection channel. That is, light beams 33a and 33b output by the light sources 31La and 31Lb are provided in the fine optical fibers and are transmitted therein, and hence, the light beams are transmitted to photo-detectors 31Ra and 31Rb through elements in the order of the optical interconnection block 20L of the transmitter, the optical fiber bundle 34 in the optical PCB, and the optical interconnection block 20R of the receiver without generation of crosstalk between layers or between channels.

The tolerance of misalignment is not increased in the alignment between the optical transmit and receive modules 30L and 30R and the optical interconnection blocks when the optical fiber bundle is used in the optical interconnection blocks but the same is not used in the optical waveguide, as shown in FIG. 5. Compared to this, the tolerance of misalignment of either the optical transmit module 30L or the optical receive module 30R is increased when the optical fiber bundle is also used in the optical waveguide.

For example, when the optical transmit module 30L is provided at a random position of the top surface 21L of the optical interconnection block with the optical fiber bundle, the light beam is transmitted to the top surface of the optical interconnection block of the receiver through the optical fibers. Hence, it is required to accurately align the optical receive module so that photo-detectors 31Ra and 31Rb of the optical receive module may be arranged on the positions of the light beams 33a and 33b of corresponding channels transmitted to the top surface of the optical interconnection block of the receiver.

In a like manner, when the optical receive module 30R is arranged at a random position on the top surface 21R of the optical interconnection block, it is needed to accurately align the optical transmit module 30L so that the light beams 33a and 33b may be transmitted to the photo-detector 31 Ra and 31 Rb of the corresponding channels.

Therefore, it is only needed to accurately align one of the optical transmit module 30L and the optical receive module 30R, while it is allowed to roughly align the other one thereof, and thus the light beam is transmitted through the elements in the order of the optical interconnection block 20L of the transmitter, the optical waveguide 34 in the optical PCB, and the optical interconnection block 20R of the receiver, so that the light beam may not digress from the propagation path in the configuration in which the optical fiber bundles are used in the optical interconnection blocks and the optical waveguide of the optical PCB.

Figure 8A:
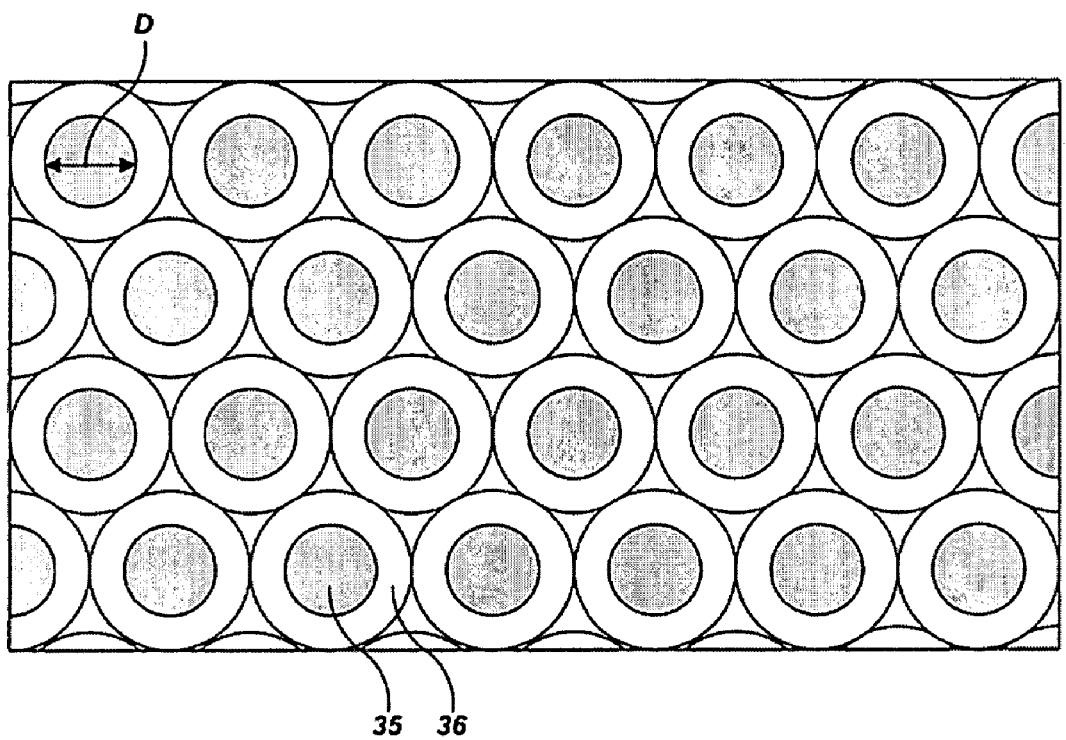
FIGS. 8A and 8B respectively show a structure of an optical fiber bundle and a structure of an optical fiber bundle bent by the angle of 90° according to an exemplary embodiment of the present invention.
Figure 8B:
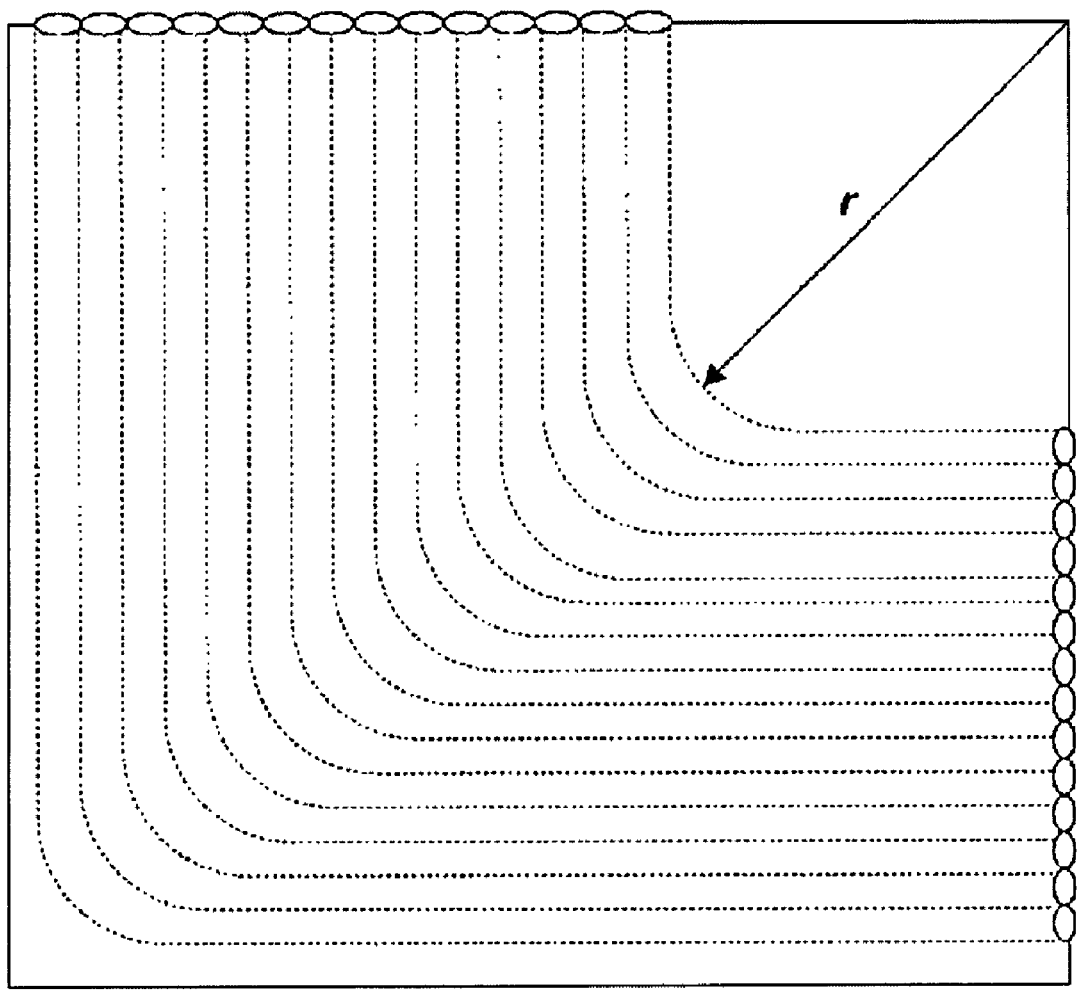

FIGS. 8A and 8B respectively show a structure of an optical fiber bundle and a structure of an optical fiber bundle bent by the angle of 90° according to an exemplary embodiment of the present invention.

Referring to FIG. 8A, the optical interconnection block 20 and the optical fiber bundle used as an optical waveguide 33 in the optical PCB are illustrated. Fine optical fibers forming the optical fiber bundle respectively have a core 35 and a clad layer 36. In a like manner of general optical fibers, the refractive index of the core is established to be lower than that of the clad layer so that the light beams may be transmitted following the core.

In this instance, the diameter D of the core 35 is established to be less than the diameter R of the light beam, and it is desirable to establish the diameter D of the core to be from 0.5 to 20 μm since the diameter of the light beams used for optical interconnection using the optical PCB is given to be. from 5 to 200 μm.

Further, the thickness of the clad layer 36 is to be determined in consideration of crosstalk between optical fibers, and an optical coupling loss. An evanescent wave is provided to a core of an adjacent optical fiber to generate crosstalk when the clad layer 36 is thin, and the optical coupling loss is increased when the clad layer 36 is thick. That is, most of the light beams are transmitted in the core 35, the optical coupling loss is proportional to clad area/(core area+clad area), and hence, the optical coupling loss is further decreased as the clad layer 36 becomes thinner.

Referring to FIG. 8B, the optical fiber bundle can be bent by the angle of 90° when the radius r of inside curvature of the optical fiber bundle is given to be less than the optical PCB in which the optical fiber bundle is installed. Hence, it is appropriate for the radius r to range from 0.1 to 10 mm since the thickness of the optical PCB ranges from 0.1 to 10 mm.

Further, it is appropriate for the height h of the optical fiber bundle to range from 50 μm to 10 mm since it is desirable for the height h thereof to be greater than the diameter R (from 5 to 200 μm) of the light beam 24 and be less than the thickness of the optical PCB. The length L of the optical interconnection block can be varied from more than 50 μm appropriate for a single channel to several tens of centimeters corresponding to the width of the optical PCB since the length L can be varied depending on the number of channels and channel pitches.

Therefore, the above-described exemplary embodiment applies optical fiber bundles to the optical PCB, into which optical waveguides are installed, and the optical interconnection blocks, to thus generate optical paths. The optical PCB and the optical interconnection blocks using optical fiber bundles increase the tolerance of misalignment of optical paths compared to the prior art using a single optical fiber, and easily realizes multi-layered optical connection. In this instance, the optical fiber bundles are made of plastic optical fibers (POFs) or silica optical fibers, and the optical interconnection block includes an optical fiber bundle bent by the angle of 90° and installed in a filler.

Therefore, when the optical interconnection block is arranged into a groove in the optical PCB, the light beams output by the light source provided on the optical PCB are horizontally transmitted in the optical waveguides, and are then transmitted to the photo-detector provided on the optical PCB.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An optical printed circuit board (PCB) having a multi-channel optical waveguide, comprising:
    an optical waveguide having an optical path for transmitting light beams;
    a groove for penetrating the optical waveguide; and
    an optical interconnection block inserted in the groove and connected to the optical waveguide to transmit the light beams,
    wherein the optical interconnection block includes an optical fiber bundle bent by the angle of 90°, and a diameter of a core of an optical fiber of the optical fiber bundle ranges from 0.5 to 20 μm.

2. The optical PCB of claim 1, wherein the optical interconnection block connects a plurality of multi-layered optical waveguides to transmit light beams to the optical waveguides.

3. The optical PCB of claim 1, wherein the optical waveguide comprises a plurality of optical fibers, and a diameter of a core of the optical fiber ranges from 0.5 to 20 μm.

4. The optical PCB of claim 1, wherein a radius of inside curvature of the optical fiber bundle ranges from 0.1 to 10 mm within the thickness of the optical PCB.

5. The optical PCB of claim 1, wherein the optical fiber bundle is installed as a medium of the multi-channel optical waveguide in the optical PCB.

* * * * *